United States Patent
Bernstein et al.

(10) Patent No.: US 6,259,940 B1
(45) Date of Patent: Jul. 10, 2001

(54) METHOD OF PERFORMING MAGNETIC RESONANCE ANGIOGRAPHY USING TWO-DIMENSIONAL IMAGING AND DE-RATED GRADIENTS

(75) Inventors: Matthew A. Bernstein; John Huston, III, both of Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 09/301,246

(22) Filed: Apr. 28, 1999

(51) Int. Cl.[7] .................................................. A61B 5/055
(52) U.S. Cl. ........................ 600/410; 600/420; 324/309
(58) Field of Search ........................... 600/410, 420, 600/419; 324/309, 306

(56) References Cited

U.S. PATENT DOCUMENTS

| | | | |
|---|---|---|---|
| Re. 32,701 | | 6/1988 | Moran .................................. 324/309 |
| 5,281,916 | * | 1/1994 | Hinks et al. ......................... 324/309 |
| 5,422,576 | * | 6/1995 | Kao et al. ........................... 324/309 |
| 5,652,513 | * | 7/1997 | Liu et al. ............................. 324/306 |
| 5,719,498 | * | 2/1998 | Hausmann ............................ 324/309 |
| 5,881,728 | * | 3/1999 | Mistretta et al. . |
| 5,924,987 | * | 7/1999 | Meaney et al. ....................... 600/420 |
| 5,928,148 | * | 7/1999 | Wang et al. .......................... 600/420 |
| 6,009,341 | * | 12/1999 | Edelman . |
| 6,011,392 | * | 1/2000 | Zhou et al. . |
| 6,018,600 | * | 1/2000 | Levin et al. ......................... 382/284 |

OTHER PUBLICATIONS

Signa Advantage Applications Guide, Vascular Magnetic Resonance Imaging, $2^{nd}$ Edition.

* cited by examiner

*Primary Examiner*—Marvin M. Lateef
*Assistant Examiner*—Shawna J Shaw
(74) *Attorney, Agent, or Firm*—Quarles & Brady, LLP

(57) ABSTRACT

In an MRI system using high-performance gradient hardware, a method includes de-rating selected lobes in a 2DTOF imaging pulse sequence; employing images from the two-dimensional imagery to detect the presence of disease; and performing three-dimensional contrast-enhanced MRA if disease was detected at a sufficiently high level to make three-dimensional imaging useful. By de-rating selected lobes of the 2DTOF imaging pulse sequence, sensitivity to carotid stenosis at or above the clinically important range of 60–70% is achieved.

20 Claims, 3 Drawing Sheets

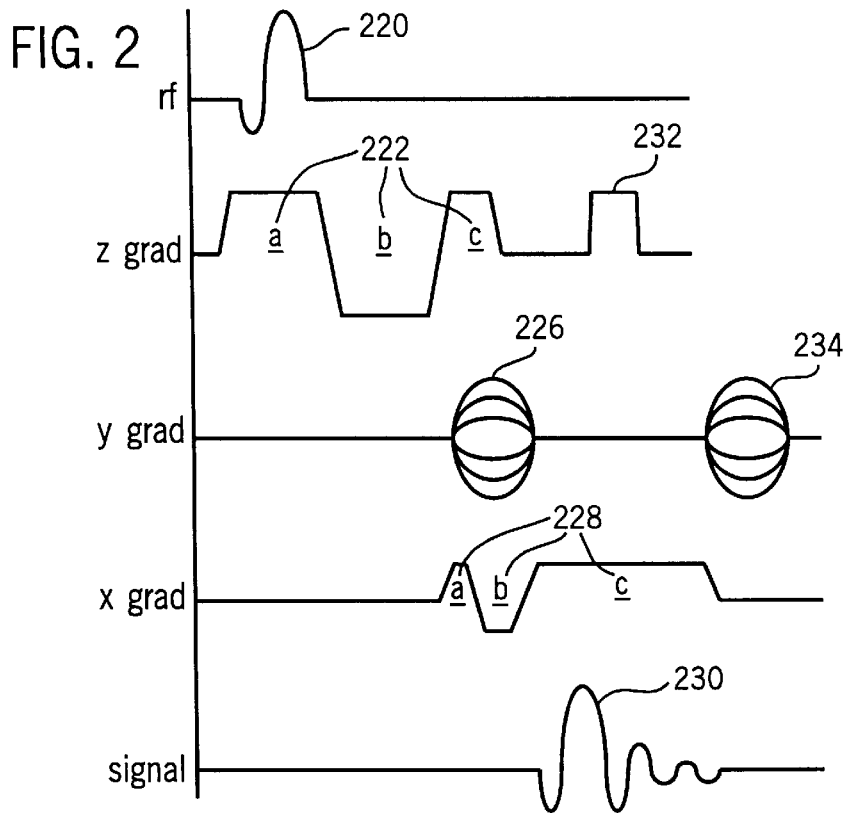
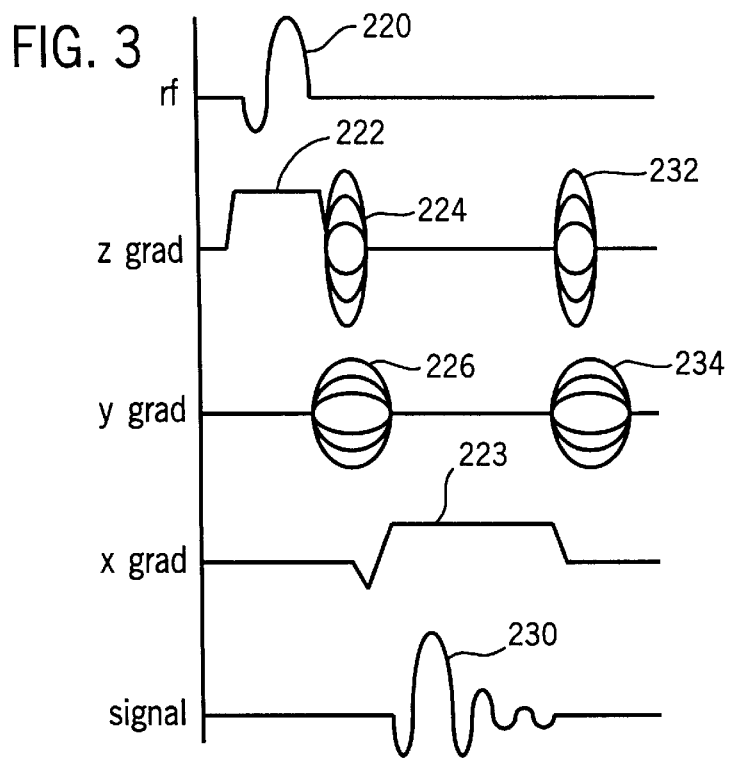

METHOD OF PERFORMING MAGNETIC RESONANCE ANGIOGRAPHY USING TWO-DIMENSIONAL IMAGING AND DE-RATED GRADIENTS

BACKGROUND OF THE INVENTION

The field of the invention is magnetic resonance angiography ("MRA"), and particularly, studies of the human vasculature which use contrast agents to enhance NMR signals for a portion of the exam.

Diagnostic studies of the human vasculature have many medical applications. X-ray imaging methods such as digital subtraction angiography ("DSA") have found wide use in the visualization of the cardiovascular system, including the heart and associated blood vessels. One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Images showing the circulation of blood in the arteries and veins of the kidneys, the neck and head, the extremities and other organs have immense diagnostic utility. Unfortunately, however, these x-ray methods subject the patient to potentially harmful ionizing radiation and often require the use of an invasive catheter to inject a contrast agent into the vasculature to be imaged. There is also the issue of increased nephro-toxicity and allergic reactions to iodinated contrast agents used in conventional x-ray angiography.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

MR angiography (MRA) has been an active area of research. Techniques that have been proposed and evaluated include time-of-flight, phase contrast, and contrast-enhanced MRA. The first class, time-of-flight (TOF) techniques, consists of methods which use the motion of the blood relative to the surrounding tissue. The most common approach is to exploit the differences in magnetization saturation that exist between flowing blood and stationary tissue. Flowing blood, which is moving through the excited section, is continually refreshed by spins experiencing fewer excitation pulses and is, therefore, less saturated. The result is the desired image contrast between the high-signal moving blood and the low-signal stationary tissues.

MRA methods have also been developed that encode motion into the phase of the acquired signal as disclosed in U.S. Pat. No. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase difference or complex difference between the pair of velocity-encoded images.

To enhance the diagnostic capability of MRA a contrast agent such as gadolinium can be injected into the patient prior to the MRA scan. Excellent diagnostic images may be acquired using contrast-enhanced MRA if the data acquisition is properly timed with the bolus passage.

Contrast-enhanced MRA is a well-accepted MRA technique that benefits from the relatively short TR and TE (e.g., <7 msecs. and <2 msecs., respectively) made possible through use of high-performance gradient systems. To achieve such short TR and TE, high-performance gradient systems produce gradient amplitudes and rise times on the order of 22 mTesla/meter (mT/m) and 77 Tesla/meter/second (T/m/s), respectively. Older gradient systems, referred to as "standard gradient systems," produce more modest gradient amplitudes and rise times on the order of 10 mTesla/m and 17 T/m/s, respectively.

As more standard gradient systems have been replaced by high-performance gradient systems, contrast-enhanced MRA has become more available and clinically useful. Even so, contrast-enhanced MRA does not fulfill, by itself, all desired objectives in an MRA examination. For example, in the context of analyzing the carotid arteries, two-dimensional time-of-flight (2DTOF) imaging provides an ideal localizer scan for subsequent contrast-enhanced MRA examination.

Moreover, in a paper by J. Huston III et al. entitled, "Carotid Artery: Prospective Blinded Comparison of Two-Dimensional Time-of-Flight MR Angiography with Conventional Angiography and Duplex US" (*Radiology* 1993; 186:339–344), the authors disclose that 2DTOF images of the carotid artery obtained using standard gradients reliably show a complete signal loss (i.e., a signal void) when the diameter of the artery is stenosed by 60% or more, as measured with the reference standard of conventional X-ray digital subtraction angiography. This feature is clinically useful since major clinical trials have shown endarterectomy is superior to medical therapy for patients who are symptomatic with 70% diameter stenosis, or are asymptomatic with a 60% diameter stenosis.

Thus, in determining whether to pursue endarterectomy or medical therapy, reliable detection of arterial stenosis in the range of 60% or more is highly useful. Although the paper noted above by J. Huston III et al. states that 2DTOF imaging using standard gradients facilitates reliable detection of arterial stenosis in the range of 60% or more, many MRI systems in use today employ high-performance gradients. Accordingly, it is worthwhile considering whether 2DTOF imaging using high-performance gradients reliably detects the desired degree of arterial stenosis.

It has been observed that high-performance gradients can preserve signal through stenotic segments with 2DTOF imaging. Although the arterial vessel generally appears narrowed, stenosis in excess of 75–85% is typically required before the signal is lost—unlike 2DTOF imaging using standard gradients which results in signal voids in the presence of 60% or greater arterial stenosis.

Moreover, a recently identified phenomenon, referred to as "ballooning," can result in an underestimation of the degree of arterial stenosis depicted with 2DTOF imaging under high-performance gradients. Partial volume effects and vessel motion are presently believed to be the root causes of ballooning. Thus, the phenomenon may occur when flow through a high-grade arterial stenosis results in intense signal that is averaged over multiple adjacent voxels resulting in an erroneously large apparent lumen. Consequently, the analyst of the inflated lumen will likely diagnose a lower grade stenosis, which may result in a false-negative diagnosis.

Thus, while the 2DTOF imaging technique may be used as a localizing scan to supplement the contrast-enhanced MRA exam, using the former technique with high-performance gradients limits its sensitivity in accurately detecting arterial stenosis in the clinically useful range of 60% or greater.

SUMMARY OF THE INVENTION

The present invention is a method for producing an image with NMR data acquired from a region of interest in a patient placed in an MRI system. More specifically, the method includes: positioning the patient in the MRI system; acquiring NMR image data from the region of interest using the MRI system to perform a two-dimensional imaging pulse sequence; reconstructing a two-dimensional image from the acquired two-dimensional NMR image data; employing the two-dimensional image to detect the presence of disease in the region of interest; acquiring NMR image data from the region of interest using the MRI system to perform a three-dimensional imaging pulse sequence if disease is present in the region of interest; and reconstructing a three-dimensional image from the acquired three-dimensional NMR image data. Preferably, the two-dimensional imaging pulse sequence is a 2DTOF pulse sequence with selected gradient lobes de-rated, such as certain lobes of the slice select magnetic field gradient and/or the readout magnetic field gradient. Additionally, the first acquisition of NMR image data is preferably obtained without contrast agent, while the second acquisition of NMR image data, if performed at all, is typically contrast-enhanced.

A general object of the invention is to provide a method for conducting more time efficient and cost effective MRA examinations while maintaining examination quality. More specifically, using a high-performance gradient system, a 2DTOF pulse sequence having selected gradient lobes de-rated is used as a screening tool. If the image produced from the 2DTOF pulse sequence shows stenosis at or above a certain range, then the added time and expense of contrast-enhanced three-dimensional MRA is taken. However, when the degree of stenosis depicted from the 2DTOF pulse sequence fails to rise to the critical range, then subsequent contrast-enhanced three-dimensional MRA need not be performed. The unique sensitivity of the de-rated 2DTOF pulse sequence to detect stenosis in the clinically useful range of 60% or greater is the basis for the usefulness of this pulse sequence as a screening tool in the MRA examination.

Another object of the invention is to provide a method for conducting MRA examination having both high sensitivity and specificity. As noted, the de-rated 2DTOF pulse sequence is sensitive in detecting stenosis in the clinically useful range of 60% or greater. The contrast-enhanced three-dimensional pulse scan, when performed, shows high specificity due to the excellent anatomical detail inherent in this scan type.

Still another object of the invention is to provide a method in which the initial 2DTOF scan localizes the region of interest in the patient. The localization scan facilitates more accurate positioning of the contrast-enhanced three-dimensional scan.

Yet another advantage of the invention is the minimization of image degradation resulting from Maxwell terms, gradient eddy currents, acoustic noise, and the like. This benefit is realized by de-rating the maximum gradient amplitude, increasing the gradient rise time, or providing a combination thereof for selected gradient lobes of the 2DTOF pulse sequence.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 2 is a graphic representation of a two-dimensional imaging pulse sequence, with selected gradient lobes de-rated, and which is employed in a preferred embodiment of the invention;

FIG. 3 is a graphic representation of a three-dimensional imaging pulse sequence employed in a preferred embodiment of the invention.

DESCRIPTION OF THE PREFERRED EMBODIMENT

Figure 1:
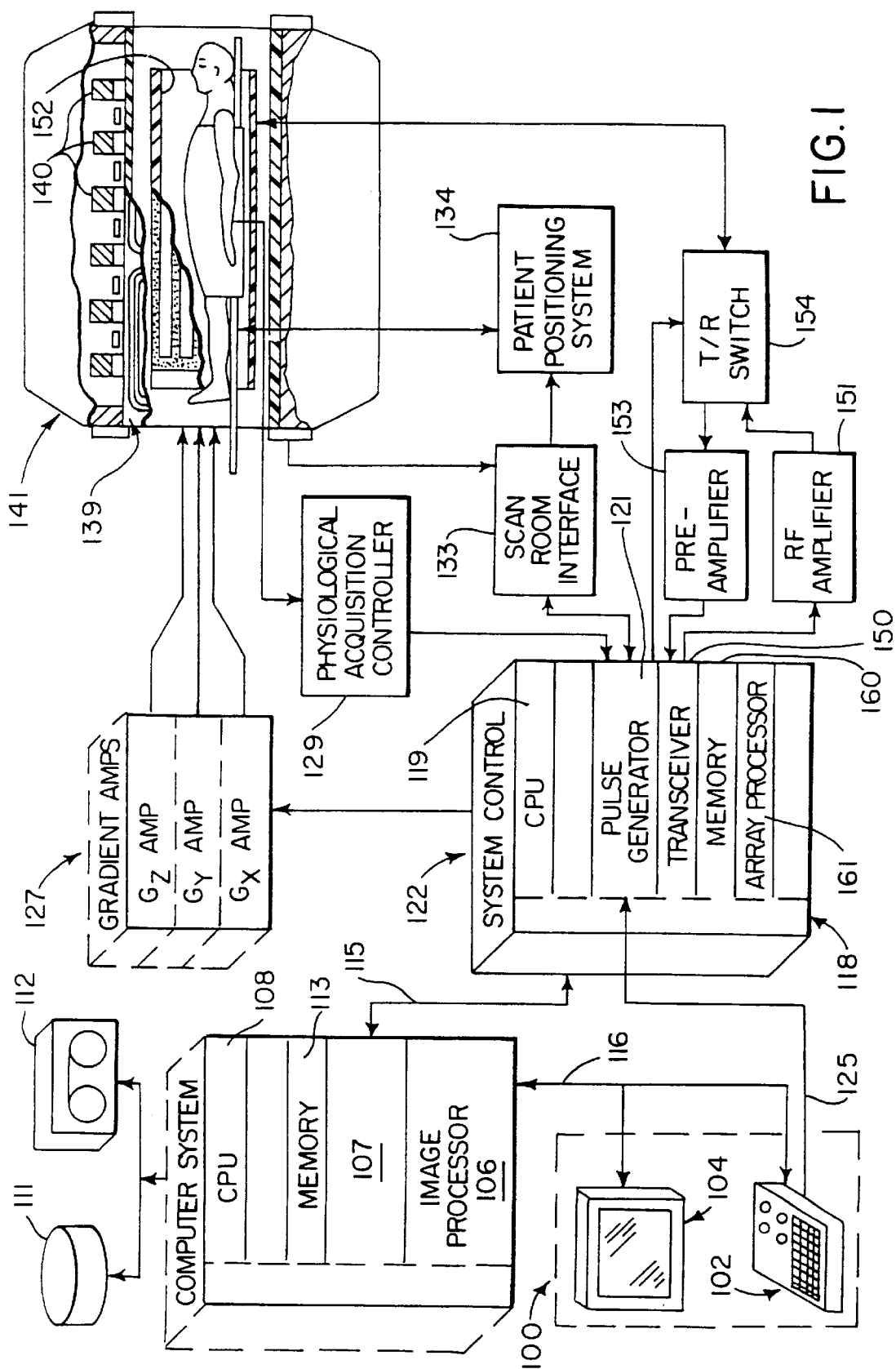
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system, it is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

Figure 4:
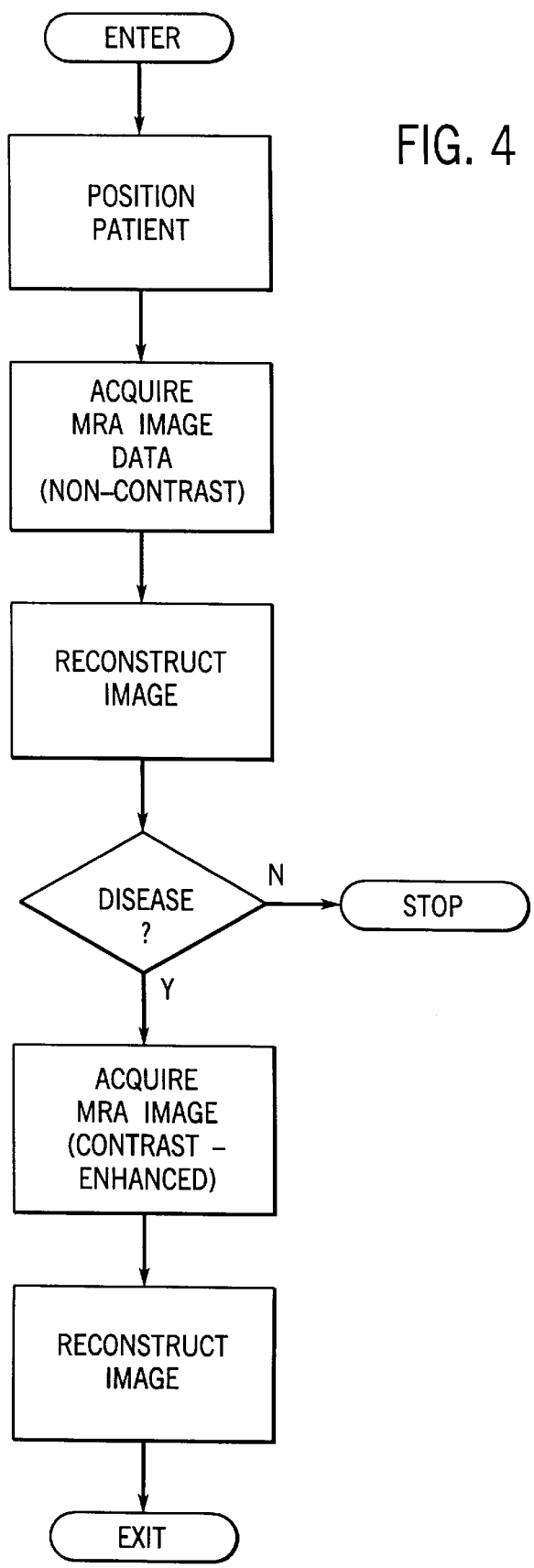
FIG. 4 is a simplified flow chart diagram depicting a preferred embodiment of the invention.

The method of the present invention is generally depicted by the simplified flow chart diagram of FIG. 4. The method preferably implements a 2DTOF imaging pulse sequence, as part of an MRI system having high-performance gradient hardware. Importantly, the preferred embodiment involves de-rating selected lobes of the 2DTOF pulse sequence, so that its flow properties are substantially identical to 2DTOF pulse sequences used in the past on standard gradient hardware. Use of such prior 2DTOF pulse sequences is disclosed in the previously cited paper entitled, "Carotid Artery: Prospective Blinded Comparison of Two-Dimensional Time-of-Flight MR Angiography with Conventional Angiography and Duplex US" (*Radiology* 1993; 186:339–344).

Referring to FIG. 4, after the patient is positioned in the MRI system, NMR image data is acquired using a two-dimensional imaging pulse sequence, preferably a 2DTOF imaging pulse sequence. Two-dimensional images are constructed, in a manner well known to those skilled in the art, and employed to detect the presence of disease in a region of interest.

Analysis of the two-dimensional images is typically performed by a trained physician who views the images for evidence of disease, though analysis of the images may be done using a computer, or any manner well known to those skilled in the art. The reason for analyzing the two-dimensional images is to detect a specified degree of disease in a region of interest in the patient from which appropriate decisions can be made regarding whether to pursue further MRA. Specifically, when the measure of disease depicted by the two-dimensional images is below a certain level, further MRA is deemed unnecessary, and therefore need not be performed. Alternatively, indication of a higher amount of disease suggests that additional MRA may be useful. Precisely what constitutes the critical degree or amount of disease may vary from one region of interest to the next. However, a critical range of disease is disclosed below, by way of example, in a description of how this methodology would be used to analyze stenosis of the carotid artery.

Referring to FIGS. 2 and 4, MRA images of the carotid artery are first obtained, preferably using 2DTOF imaging. Although many pulse sequences may be used to practice the present invention, in the preferred embodiment a 2D gradient-recalled echo pulse sequence with flow compensation is used to acquire the NMR data. Referring particularly to FIG. 2, an RF excitation pulse 220 having a flip angle of 50–60° is produced in the presence of a flow compensated slab select gradient pulse 222 to produce transverse magnetization in the 2D slice of interest (typically 1.5 to 2.5 mm thick). The flow compensated slab select gradient pulse 222 comprises a slice select lobe 222a, a dephasing lobe 222b, and a slice select flow compensation lobe 222c. This is followed by a phase encoding gradient pulse 226 directed along the y axis. A flow compensated readout gradient pulse 228 directed along the x axis follows and a partial echo (60&) NMR signal 230 is acquired and digitized as described above. The flow compensated readout gradient pulse 228 comprises a readout lobe 228a, a refocusing lobe 228b, and a readout flow compensation lobe 228c. After the acquisition, a spoiler gradient pulse 232 is applied along the z axis and a rewinder gradient pulse 234 is applied to rephase the magnetization before the pulse sequence is repeated as taught in U.S. Pat. No. 4,665,365.

As is well known in the art, the pulse sequence is repeated and the phase encoding pulse 226 is stepped through a series of values to sample the 2D k-space in the field of view. In the preferred embodiment 128 phase encodings are employed along the y axis. Sampling along the $k_x$ axis is performed by sampling the echo signal 230 in the presence of the flow compensated readout gradient pulse 228 during each pulse sequence. It will be understood by those skilled in the art that only a partial sampling along the $k_x$ axis is performed and the missing data is computed using a technique such as homodyne reconstruction or by zero filling. Typical values for TE and TR of the derated 2DTOF pulse sequence are 8.7 ms and 30 ms, respectively.

As mentioned, the MRI system preferably includes high-performance gradient hardware, while the method of operation for the present invention involves de-rating selected lobes of the 2DTOF pulse sequence, so that its flow properties are substantially identical to 2DTOF pulse sequences produced using standard gradient hardware. Lobes typically selected for de-rating are the slice select gradient lobes 222 B and C, and readout gradient lobes 228 B and C. Lobes 222 B and C and 228 B and C are respectively referred to by those skilled in the art as a dephasing lobe, a slice select flow compensation lobe, a refocusing lobe, and a readout flow compensation lobe. Typically, all four lobes (222 B and C and 228 B and C) are de-rated, though any subcombination thereof may be de-rated. A de-rated lobe is defined as one having: (1) gradient magnitude less than 22 mTesla/meter (though preferably on the order of 10 mT/m) or; (2) gradient rate of change less than 77 Tesla/meter/second (though preferably on the order of 17 T/m/s); or 3) a combination of both (1) and (2). Appropriate modification of the controls for the high-performance gradient hardware results in the desired degree of de-rating for the selected lobes.

Images produced from the de-rated 2DTOF imaging pulse sequence show signal voids in regions of the carotid artery having 60% or greater stenosis. As mentioned, sensitivity to this degree of stenosis in the carotid artery is clinically useful, since stenosis below this range is most appropriately handled with medication, while stenosis of this severity, is more appropriately treated with surgery. Thus, when no appreciable voids are shown in the two-dimensional images, the additional time and expense of contrast-enhanced three-dimensional MRA may be avoided.

However, when the two-dimensional images show voids in the carotid artery, further MRA is conducted. Specifically, three-dimensional contrast-enhanced MRA is conducted, as it has greater anatomic detail in its images, and improved signal-to-noise ratios corresponding to the images produced. Additionally, the initial images from the de-rated 2DTOF imaging can be used to more precisely target the subsequent three-dimensional contrast-enhanced exam.

FIG. 3 represents a pulse sequence for use in three-dimensional contrast-enhanced MRA. An RF excitation pulse 220 having a flip angle of 45° is produced in the presence of slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

As is well known in the art, the pulse sequence is repeated and the phase encoding pulses 224 and 226 are stepped through a series of values to sample the 3D k-space. In the preferred embodiment 48 phase encodings are employed along the z axis and 224 phase encodings are employed along the y axis. For each particular y phase encoding, therefore, 48 acquisitions with 48 different z phase encodings are performed to sample completely along the $k_x$ axis. This is repeated 224 times with 224 different y phase encodings to sample completely along the $k_y$ axis.

It will be apparent to those skilled in the art that a number of further techniques can be used in combination with or in lieu of the methodology discussed thus far without departing from the scope of the claimed invention. For example, the proposed methodology need not be limited to two-dimensional imaging followed by three-dimensional imaging. Rather, regardless of the dimensional distinction between initial and follow-on scans, initial imaging may be done without contrast agent, while subsequently implementing contrast-enhanced imaging if the initial scan revealed disease meriting such additional attention. In either case, the initial scan is preferably implemented, as part of a high-performance gradient system with selected lobes de-rated.

What is claimed is:

1. A method for producing an image with NMR data acquired from a region of interest in a patient placed in an MRI system, the steps comprising:
   a) positioning the patient in the MRI system;
   b) acquiring NMR image data from the region of interest using the MRI system to perform a two-dimensional imaging pulse sequence using a de-rated magnetic gradient;
   c) reconstructing a two-dimensional image from the acquired two-dimensional NMR image data;
   d) employing the two-dimensional image to detect the presence of disease in the region of interest;
   e) acquiring NMR image data from the region of interest using the MRI system to perform a three-dimensional imaging pulse sequence if disease is present in the region of interest as determined by an examination of the two-dimensional image; and
   f) reconstructing a three-dimensional image from the acquired three-dimensional NMR image data.

2. The method as recited in claim 1 in which performing the two-dimensional imaging pulse sequence of step b) includes the steps of:
   a) generating an RF excitation magnetic field in the presence of a polarizing magnetic field and a slice select magnetic field gradient to produce transverse magnetization in spins located in a selected slice;
   b) refocusing the transverse magnetization to produce an NMR echo signal having a peak amplitude which occurs at a time TE after the generation of the RF excitation magnetic field;
   c) applying a readout magnetic field gradient to the spins subjected to the polarizing magnetic field to impart a first phase component into the NMR echo signal which is indicative of spin location along a readout axis;
   d) applying a phase encoding magnetic field gradient to the spins subjected to the polarizing magnetic field to impart a second phase component into the NMR echo signal which is indicative of spin location along an axis perpendicular to said readout axis; and
   e) sampling the NMR echo signal.

3. The method as recited in claim 2 which includes de-rating selected lobes of the slice select magnetic field gradient.

4. The method as recited in claim 3 in which amplitude of the selected lobes is de-rated to less than 22 mTesla/meter.

5. The method as recited in claim 3 in which the selected lobes have a rate of change of less than 77 Tesla/meter/second.

6. The method as recited in claim 3 in which the selected lobes have amplitude less than 22 mTesla/meter, and a rate of change of less than 77 Tesla/meter/second.

7. The method as recited in claim 3 in which the selected de-rated lobes of the slice select magnetic field gradient are selected from a group consisting of a dephasing lobe and a flow compensation lobe.

8. The method as recited in claim 2 which includes de-rating selected lobes of the readout magnetic field gradient.

9. The method as recited in claim 8 in which amplitude of the selected lobes is less than 22 mTesla/meter.

10. The method as recited in claim 8 in which the selected lobes have a rate of change of less than 77 Tesla/meter/second.

11. The method as recited in claim 8 in which the selected lobes have amplitude less than 22 mTesla/meter, and a rate of change of less than 77 Tesla/meter/second.

12. The method as recited in claim 8 in which the selected de-rated lobes of the readout magnetic field gradient are selected from a group consisting of a refocusing lobe and a flow compensation lobe.

13. The method as recited in claim 2 which includes de-rating selected lobes of the slice select magnetic field gradient and the readout magnetic field gradient.

14. The method as recited in claim 13 in which amplitude of the selected lobes is less than 22 mTesla/meter.

15. The method as recited in claim 13 in which the selected lobes have a rate of change of less than 77 Tesla/meter/second.

16. The method as recited in claim 13 in which the selected lobes have amplitude less than 22 mTesla/meter, and a rate of change of less than 77 Tesla/meter/second.

17. The method as recited in claim 1 in which step e) is performed after injecting the patient with a contrast agent.

18. The method as recited in claim 1 which includes also employing the two-dimensional image to locate a precise target within the region of interest from which to acquire the NMR image data using the three-dimensional imaging pulse sequence.

19. The method as recited in claim 1 in which the region of interest includes a carotid artery.

20. A method for producing an image with NMR data acquired from a region of interest in a patient placed in an MRI system, the steps comprising:

a) positioning the patient in the MRI system;

b) acquiring NMR image data from the region of interest using the MRI system to perform an MRA imaging pulse sequence without contrast and with a de-rated magnetic field gradient;

c) reconstructing an MRA image from the acquired non-contrast-enhanced NMR image data;

d) employing the MRA image to detect the presence of disease in the region of interest;

e) acquiring NMR image data from the region of interest using the MRI system to perform a contrast-enhanced imaging pulse sequence if disease is present in the region of interest as determined in step d); and f) reconstructing a three-dimensional image from the acquired contrast-enhanced NMR image data.

* * * * *